United States Patent
Chiang et al.

(10) Patent No.: US 6,307,256 B1
(45) Date of Patent: *Oct. 23, 2001

(54) SEMICONDUCTOR PACKAGE WITH A STACKED CHIP ON A LEADFRAME

(75) Inventors: Cheng-Lien Chiang, Taipei; Shyi-Ching Liau, Hsinchu, both of (TW)

(73) Assignee: Apack Technologies Inc., Hsinchu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/178,769

(22) Filed: Oct. 26, 1998

(51) Int. Cl.[7] .................................................. H01L 23/495
(52) U.S. Cl. ............................................ 257/668; 257/670
(58) Field of Search .................................. 257/668, 670, 257/672, 673, 674, 676, 684

(56) References Cited

U.S. PATENT DOCUMENTS

| | | | |
|---|---|---|---|
| 5,029,386 | * 7/1991 | Chao et al. | 29/827 |
| 5,167,361 | * 12/1992 | Liebman et al. | 228/180.2 |
| 5,387,814 | * 2/1995 | Baudouin et al. | 257/690 |
| 5,406,699 | * 4/1995 | Oyama | 29/827 |
| 5,804,880 | * 9/1998 | Mathew | 257/779 |
| 5,914,530 | * 6/1999 | Murakami et al. | 257/666 |
| 5,949,135 | * 9/1999 | Washida et al. | 257/685 |

* cited by examiner

*Primary Examiner*—Olik Chaudhuri
*Assistant Examiner*—Douglas A. Wille
(74) *Attorney, Agent, or Firm*—McDermott, Will & Emery

(57) ABSTRACT

The present invention provides a leadframe package formed by flip chip on leadframe technique. The chips are face to face attached on both sides of the leadframe surface. Another embodiment according to the present invention is that the chips are back to back attached on a leadframe. A chip with smaller size is stacked on a further chip with larger size. The smaller chip is connected to the leadframe by wire bonding. The present invention includes a first chip attached on the leadframe by using flip chip technology. The first chip has a plurality of conductive bump for electrically transferring signal to external. The tape has a plurality of openings or slots through the tape. Each opening exposes the terminal of the inner leads. Thus, a further chip can be set on the opposite major surface of the leadframe by means of the openings or slots. The second chip can be optionally face to face formed on the other side of the leadframe or back to back stacked on the first chip. The second chip is connected to the leadframe by wire bounding under this structure.

11 Claims, 9 Drawing Sheets

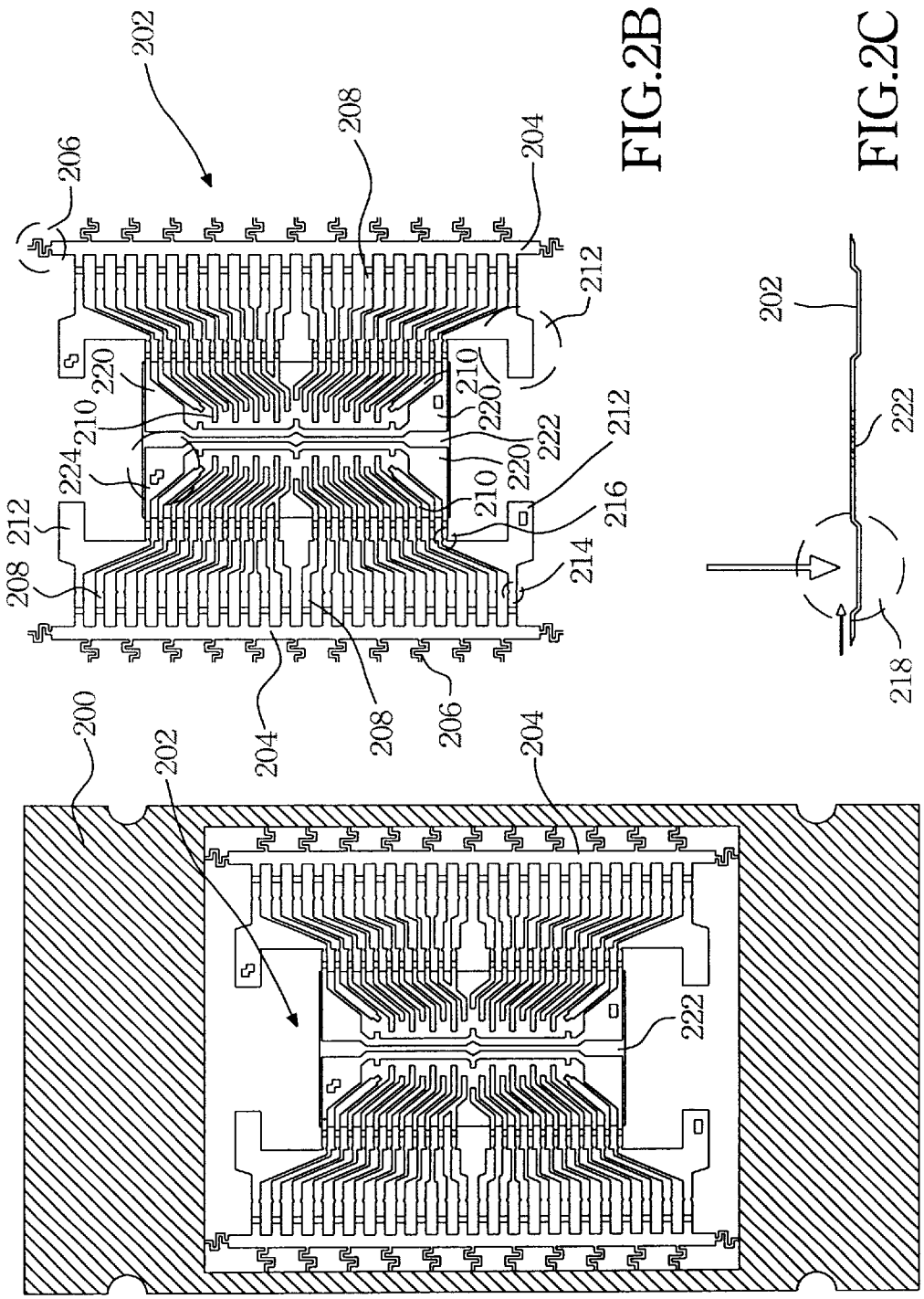

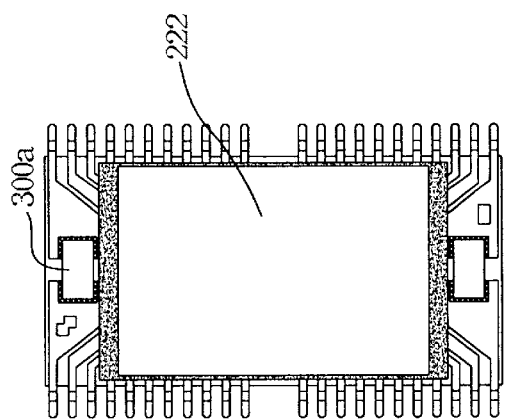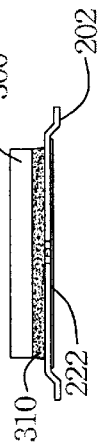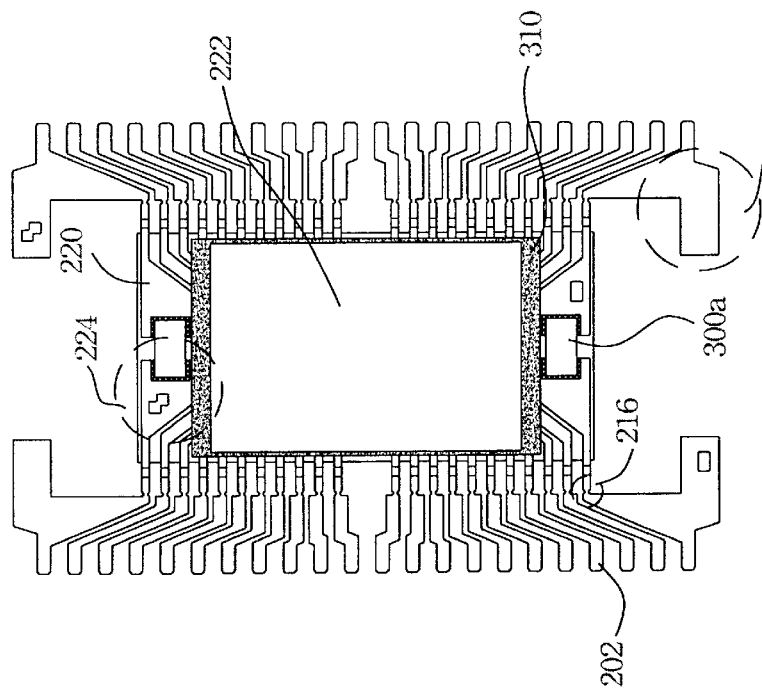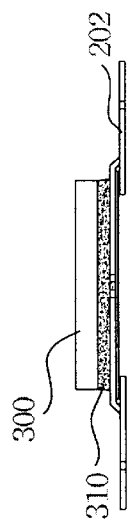
FIG.7A
FIG.7B
FIG.6A
FIG.6B

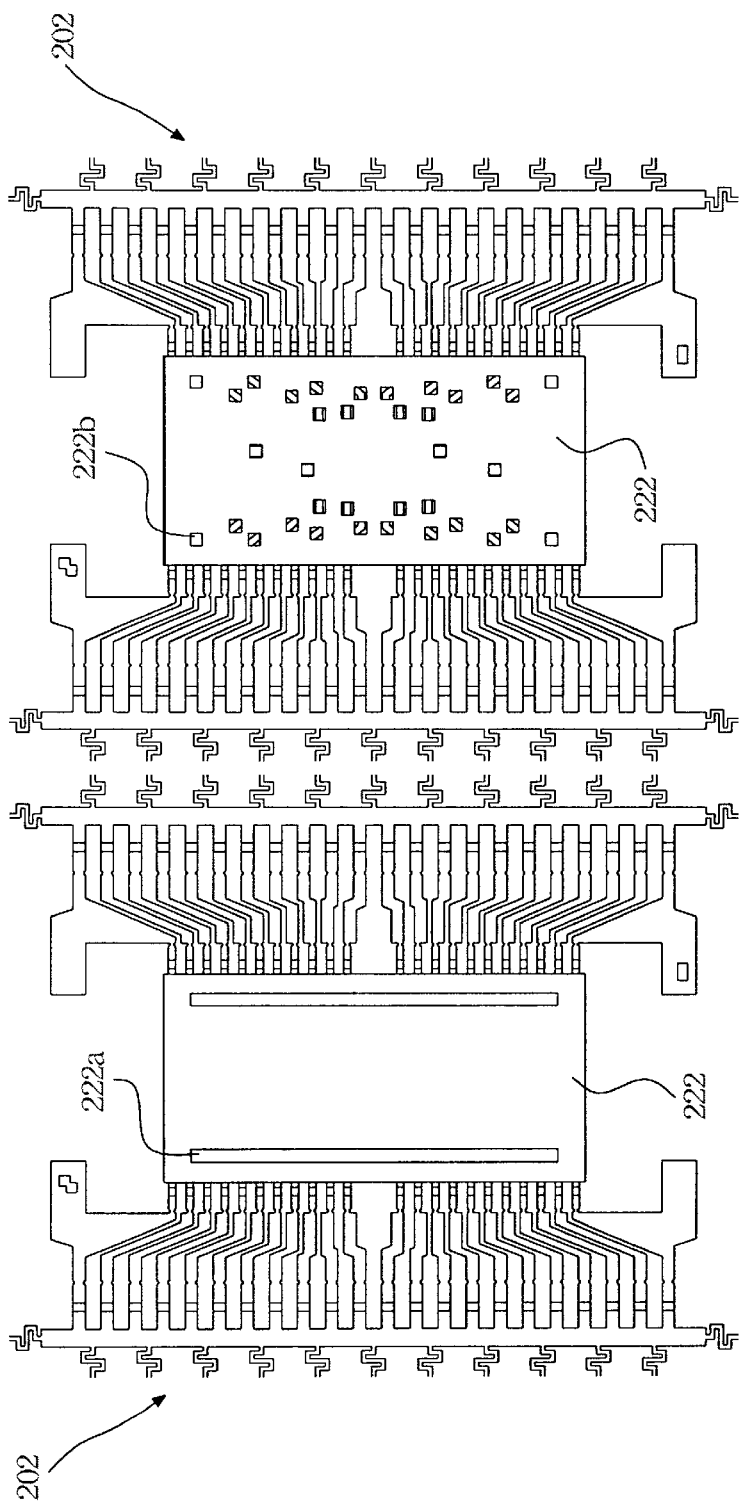
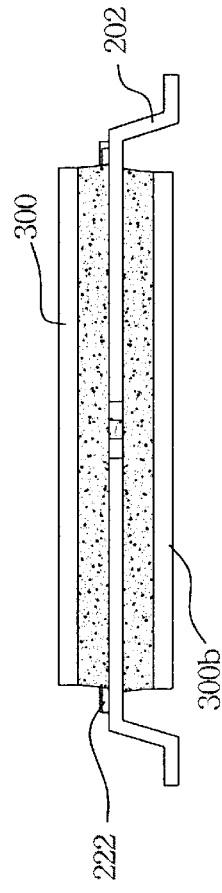
FIG.8A  FIG.8B  FIG.8C

SEMICONDUCTOR PACKAGE WITH A STACKED CHIP ON A LEADFRAME

FIELD OF THE INVENTION

The present invention relates to a semiconductor package, and more specifically, to a leadframe package with a stacked chip formed thereon.

BACKGROUND OF THE INVENTION

The trend of making package elements towards lighter, thinner, and smaller. The following major three problems are frequently encountered during the formation of the package. The first problem is the reliability of connecting points between the pins and the substrate in the package element minimization procedure; the second one is the testing problem encountered in the package element minimization procedure; and the third one is about the circuit routing on its substrate in the package element minimization procedure.

(1) The reliability problem of connecting points between the package element pins and the substrate:

This problem comes mainly from the fatigue destruction of connecting points. There are three factors which affect the fatigue destruction of connecting points: one is their geometrical shapes, another is the difference between the coefficients of thermal expansion (CTEs) of the materials on both sides of the connecting point, and the other is the distance between the connecting point and the geometrical center. In the respect of geometrical shapes, traditional leadframe type package elements have thin and long pins and, on the pins extending from the package body to the substrate, there is a portion that can be distorted. The thermal stress destruction to the connecting points can be lowered by slightly displacing the pins of this type of elements. But for the BGA type package elements, their electrical transferring members are spherical and therefore there is no such "slightly displacing" mechanism to absorb thermal stress. As to the difference between the CTEs of the materials on both sides of the connecting point, since the spherical pins cannot be slightly displaced to lower thermal stress as do the leadframe pins, this CTE difference becomes an indicator of fatigue destruction for spherical pins. Namely, the more difference there is between the CTEs on both sides of the spherical connecting point, the more easily fatigue destruction will happen. Thus, currently the planting area of BGA packages will mostly prevent from the projection area on the wafer. The reason is that the effective CTE of the direct projection area on the substrate will decrease because of the constrain effect of the wafer and consequently enlarge the CTE difference on both sides. For each kind of CSP, which uses spherical metal as electrical connecting members, the footprint of package elements almost occupies the whole projection area of the wafer so that those connecting members can only be distributed within the projection area. This results in serious fatigue destruction problem for CSP connecting points. Current resolution to this problem is to apply underfill around the spherical pins followed by baking to dry the underfill so as to strengthen its ability against fatigue. Nonetheless, the above mending procedure is not in accord with the standard SMT composition procedure. For ordinary SMT composition factories, in addition to the extra equipment for applying underfill, it will also harm other finished elements owing to the high temperature during the baking and drying procedures. In observation of this, inserting elastomer between the wafer and the soft circuit board conveying stannic balls can eliminate the influence of the wafer on the CTE of the circuit board for the CSP structure of BGA, as shown in FIG. 1A. Additionally, FIG. 1B shows the CSP structure of small outline no lead (SON) by Fujitsu and that of USON by LG (Gold Star). In spite that the connecting pins are of lead structure and the CTE difference on both sides of the connecting points is small, yet the fatigue lifetime of these CSP elements still does not exceed 1000 cycles owing to the lack of "slightly displacing" mechanism at the whole connecting point. The resolution of above issue in accordance with the present invention is to take the traditional geometrical outlook of the lead pins.

(2) The testing problem:

The design of the electricity contact of the test connecting point is according to the connecting pins for traditional test sockets. These test connecting points are like curved reeds. After the BGA elements, which have spherical connecting members, were developed, the curved reed structure at the test connecting points is still feasible because the pitch among pins is large enough. This curved reeds structure has a dowel, which is inserted into the circuit board, on one end and a plate-shape contact cushion on the other. For either connecting pins or spherical pins, there is a size error, which is about ⅔ the side of a contact cushion, at the contact point on the cushion for manufacturers to produce sockets. However, when CSP elements, which also have spherical connecting members, were realized, the pitch among spherical pins is so small that traditional curved reed structure is not suitable for electricity contact connecting points. The connection is achieved by ball-to-hole method. Now, the socket hole usually has the probe or metal filament with conductivity. If the sizes of planting are too different when making CSP, it is possible to cause ill contact or open circuit between the ball and the probe or metal filament in the hole and to affect test results. Moreover, traditional test elements utilize geometrical outlook of package elements to fit the pins and the test contact cushion. Therefore, the size error of the elements determines allowable production error in the fitting between pins and the test contact cushion. (Basically, all objects have their production errors.) While the outlook size of CSP elements is shrunk to about that of the wafer and the production error of spherical pins is under 1 mil, the holes on sockets can hardly be made smaller than 1 mil (0.025 mm). Consequently, CSP elements have difficulty in fitting. The resolution is to utilize traditional contact for lead pins. The outlook size of pins has to comply with the JEDEC standards so that tests can be made by traditional sockets but by otherwise tools. After tests are completed, the lead pins should be cut shorter to make the whole size close to that of wafer.)

(3) The circuit routing problem:

It is inevitable to increase layers or to use technology with higher cost to produce substrates because part of the routing on them needs jumps as a consequence of the smaller and smaller pin pitch of package elements. The resolution of aforesaid problem according to the present invention is to stack wafers in face-to-face or back-to-back methods on leadframes. At the same time, other passive elements can be placed on these wafers and also be stacked on themselves. The routing on conveying substrates will be easier and cheaper via such rerouting on leadframes and wafers.

SUMMARY OF THE INVENTION

An object of the present invention is to provide a leadframe package with stacked chip formed thereon by means of flip chip technology.

A further object of the present invention is to provide a chip scale package.

The present invention includes a leadframe formed on a side rail by supporting bars having a plurality of flexible connecting members formed thereon. One terminal of each inner lead is connected to one end of an outer lead, and the other end of the outer lead is connected on a supporting bar. Protruding portions (or alignment elements) are formed at the periphery area of the regions for forming outer leads. One terminal of the protruding portions are connected to the supporting bars. Each outer lead has a first separating portion, preferably V shape recessed portions, formed thereon for separating the leadframe from the side rail in the first separating procedure. Similarly, each outer lead also has a second separating portion, preferably also V shape recessed portions, formed thereon for separating the inner lead from the outer lead in the second separating procedure. The outer lead area is indented from the surface of the leadframe such that the structure acts as a cushion during the down-set process. Power and ground buses are arranged at the periphery area of the regions for forming inner leads. The power bus or the ground bus are configured in a shape similar to L shape. An adhesive material is formed under the inner leads.

A first chip is attached on the leadframe by adhesive, conductive material such as solder paste using flip chip technology. The chip has a plurality of conductive bump for electrically transferring signal to external. The green lacquer is painted on a portion of the inner leads Alternatively, the green lacquer can be painted on The area of the terminal of the inner leads can be coated with welding material like solder, flux by printing or dispensing. The tape has a plurality of openings or slots that are through the tape. Each opening exposes the terminal of the inner lead. Thus, a further chip can be set on the opposite major surface of the leadframe by means of the openings or slots. The second chip can be face to face formed on the other side of the leadframe or back to back stacked on the first chip. The second chip is connected to the leadframe by wire bounding under this structure.

BRIEF DESCRIPTION OF THE DRAWINGS

FIGS. 2A to 2B are top view diagrams of a leadframe according to the present invention.

FIG. 2C is a side view diagram of the leadframe in FIG. 2B according to the present invention.

FIGS. 6A and 7A are the packages illustrating the steps of separating the outer leads.

FIGS. 6B and 7B are side view diagrams of the leadframes in FIGS. 6A and 7B according to the present invention, respectively.

FIG. 8A to FIG. 8C shows the face to face package according to the present invention.

DETAILED DESCRIPTION OF THE PREFERRED EMBODIMENT

Figure 1B:
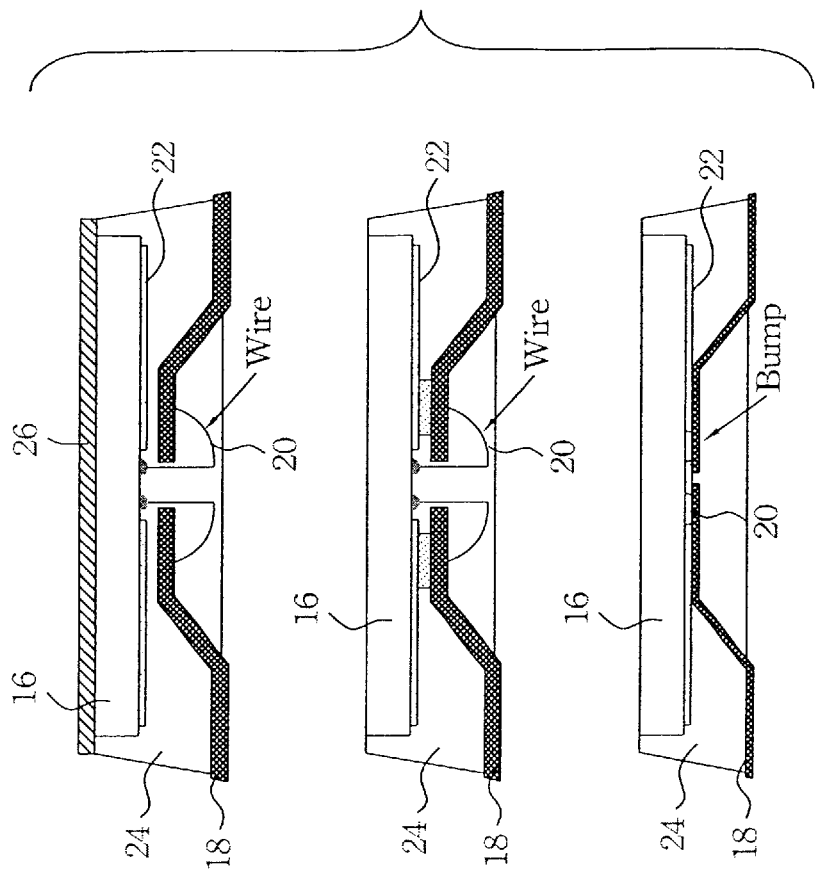
FIG. 1A and FIG. 1B are cross sectional views of structures of prior arts.
Figure 1A:
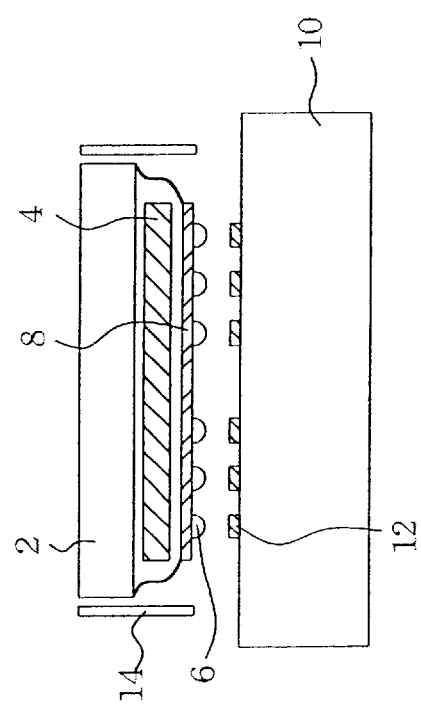
Figure 3A:
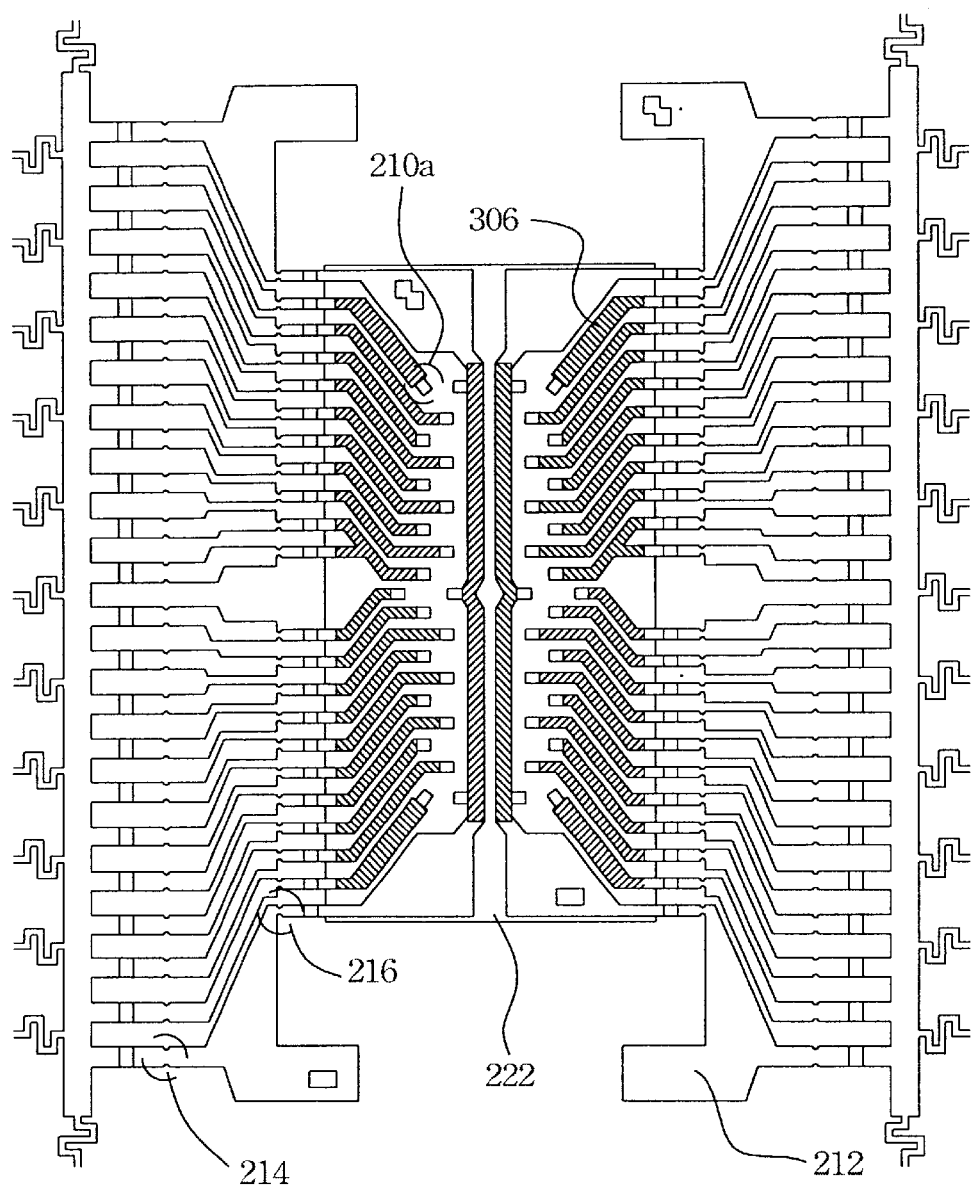
FIG. 3A is a top view diagram of a leadframe illustrating green lacquer coated a portion of the inner leads.
Figure 3B:
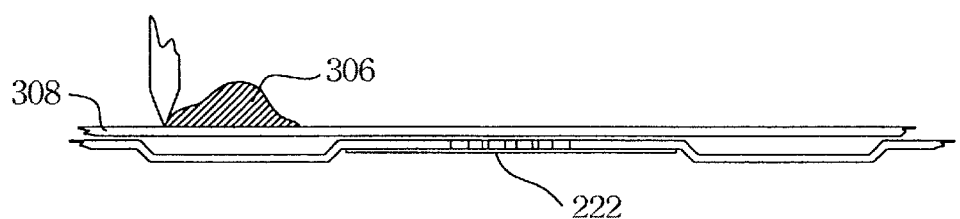
FIG. 3B is a side view diagram of the leadframe in FIG. 3A according to the present invention.
Figure 4:
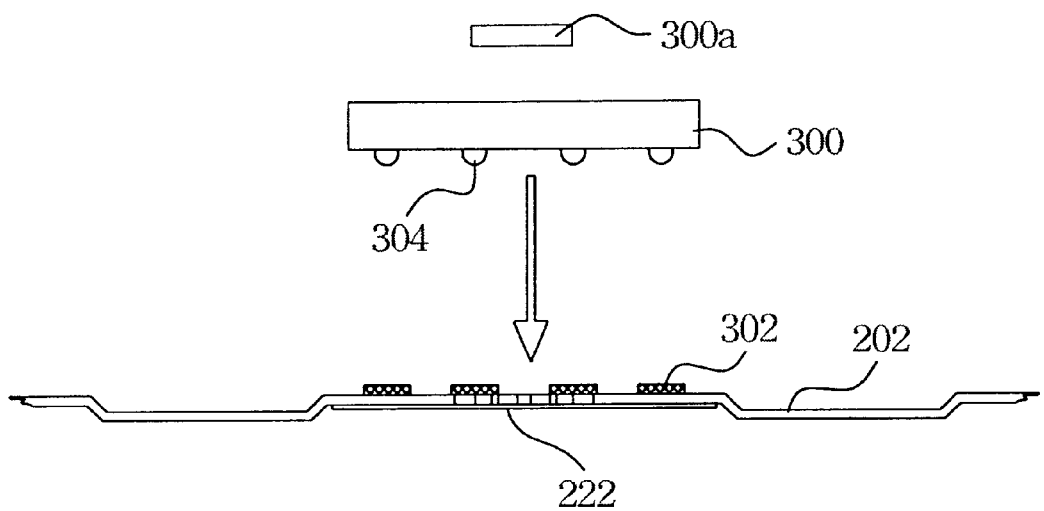
FIG. 4 to FIG. 5 are cross sectional views illustrating the steps of connecting the chip and the leadframe according to the present invention.

The present invention discloses a novel leadframe to connect a chip formed thereon by means of flip chip technology. Chips are face to face formed on the both sides of the leads of the leadframe by using flip chip on leadframe technique. Alternative, these chips can also be configured in back to back arrangement. Then, the gold wires of the chip are connected to leads from the aluminum pad on the chip by wire bond. Thus, the package according to the present invention with a chip stacked on the leadframe has a size as small as the size of the chip. A further chip can be stacked on the previous chip. The leadframe and the package according to the present invention are described as follows.

FIGS. 2A to 2C illustrate the embodiment of the present invention, but the present invention is not limited by the embodiment. A leadframe 202 is typically formed on a side rail 200 by supporting bars 204 having a plurality of flexible connecting members 206 formed thereon as shown in the drawing. The flexible connecting members 206 are connected between the supporting bars 204 and the side rail 200. The flexible connecting members 206 act a cushion to flexibly transfigure while an external force is applied. The outer leads 208 are connected to the supporting bars 204, respectively. Inner leads 210 are connected to the outer leads 208, respectively. In the embodiment, one terminal of each inner leads 210 is connected to one end of an outer lead 208, and the other end of the outer lead 208 is connected to a supporting bar 204. Protruding portions (or alignment elements) 212 are formed at the periphery area of the regions for forming outer leads 208. One terminal of the protruding portions 212 are connected to the supporting bars 204, respectively. The protruding portions 212 are designed for meeting the requirement of current testing apparatus. Namely, they have to suit for the JEDEC, and can be located in the socket for testing the performance of the package. One of the functions of the protruding portions 212 is to align the leadframe to the testing socket. Therefore, the protruding portions 212 are optional elements and any elements with equal function can be used to replace the protruding portions 212. For example, the alignment elements 212 may be designed with any shape to fit other type of testing apparatus.

Each outer lead 208 has a first separating portion, preferably V shape recessed portions 214, formed thereon for separating the leadframe from the side rail 200 in the first separating procedure. Similarly, each outer lead 208 also has a second separating portion, preferably also V shape recessed portions 216, formed thereon for separating the inner lead 210 from the outer lead 208 in the second separating procedure. As shown in FIG. 2C, the outer leads 208 are formed with depression regions from the surface of the leadframe 202. While an external force is applied, the flexible connecting members 206 act as cushions to reduce the displacement of the inner lead 210 during a downward procedure 218. The horizontal shift of the inner leads' 210 position can be controlled in 0.5 mil, which has been confirmed by experiment. Thus, this structure can eliminate the bridge issue caused by the misalignment between the solder balls and the leadframe. The outer leads 208 that transfigure toward inside in the down-set procedure 218 can beyond the limitation that the extension length of material is about three times of its thickness. That is because that the material is not only extended, but also curved transfigured.

Still referring to FIG. 2B, at least one lead as power or ground buses 220 is arranged at the first or the last lead of the inner leads 210. The first and the last inner leads are connected with each other by one terminal thereby surrounding the inner leads 210. Preferably, the alignment member 212 can be connected to the other terminal of the at least one lead 220, which is arranged at the first or the last lead of the outer leads 208. The power bus or the ground bus 220 and the alignment member 212 are both configured in a shape similar to L shape. Preferably, two groups consisting of the supporting bars 204, outer leads 208, alignment members 212 and the inner leads 210 are arranged in a mirror image configuration. An adhesive material 222 is attached under the inner leads 210. In the preferred embodiment, a tap can be utilized to act as the adhesive material 222. Each bus or ground bus 220 has a wider portion 224that is wider than the width of the inner leads 210 to increase the efficiency of adhesive between the inner leads 210 and the tap. In addition, decoupling capacitors or other devices can be located on the wider portion of the power, ground buses 220 or both.

Turning to FIG. 3A to FIG. 5, the chip 300 is attached on the leadframe 202 by adhesive, conductive material 302 using flip chip technology. It will be appreciated that any suitable material can be used as the adhesive, conductive material 302, for example solder paste. The chip 300 has a plurality of conductive bumps 304 for electrically transferring signal to external. In the preferred embodiment, the conductive bumps 304 are terminals of a device which permit electrical signal transfer to the chip 300. In general, the solder balls 110 are arranged in a matrix array configuration, as known in the art. The BGA is one of the candidates. The solder pastes 302 on the inner leads 210 of the leadframe 202 have to be aligned to the conductive bumps 304. As the flip chip technology, the solder pastes 304 are on the terminal 210a of the inner leads, therefore the inner lead's terminal must exhibit wettability characteristic. Other portions of the inner leads 210 have to be coated with non-wettability material. If the area for contacting with the solder paste is not confined by the non-wettability material such as green lacquer. Otherwise, the solder bumps 304 on the chip 300 will be melted and flow over the entire surface of the inner leads 210 during high temperature thermal process, which will cause the package failure. The lower drawing of the FIG. 3B depicts the method of forming the green lacquer on the inner leads 210. The green lacquer 306 is painted on the inner leads 210 indicated by the oblique line area by using a mesh 308. Alternatively, the green lacquer 306 can be painted on entire surface of the inner leads 210. Then, the wettability area is defined by photolithography technique. Namely, the terminals of the inner leads include wettability material coated thereon, and other portion of the inner leads include green lacquer coated thereon.

Figure 5:
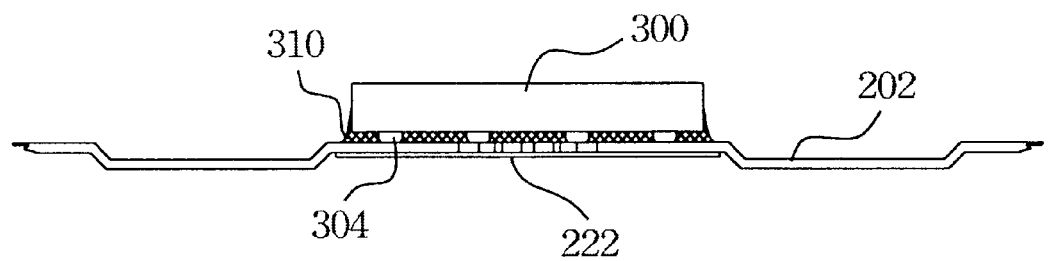

The area of the terminal of the inner leads 210 can be coated with welding material like solder, flux by printing or dispensing. In addition, a device 300a such as decoupling capacitor can be placed on the power or ground bus 220, as shown in FIGS. 4, 6A–6B and 7A–7B. Next step is performed a compound molding process to fill compound 310 between the tape 222 and the chip 300 by capillary effect, as shown in FIG. 5. Please turning to FIG. 6A, the leadframe 202 is separated from the side rail 200 by cutting the leadframe at the first separating portion 214. The package consisted of the leadframe 202 and the chip 300 can be suitable for the current JDEDC testing apparatus. This component is then tested by function test and burn-in test. The first resulting structure after the first separating still includes the alignment members and is fit for a socket of the testing apparatus. After that the second separation is performed to separate the outer leads 208 from the package by cutting the leadframe at the second separating portion 216. The final scale is similar to the size of the chip 300, after the chip is attached on the leadframe, this structure is referred to FIG. 7A.

FIG. 8A–8B depict the back side of the package. They show other modifies of the present invention. Most of the elements are the same with the previous embodiment and indicated by the same label. In these embodiments, the tape 222 has a plurality of opening 222b through the tape 222. Each opening 222b exposes the terminal of the inner leads 210. Thus, a further chip 300b can be set on the opposite major surface of the leadframe by means of the opening 220b as shown in FIG. 8C. The chip 300 and the chip 300b can be one memory, one logic chip or both can performed same function but rerouting with different memories. They could be different chip formed by different process. Alternatively, one is active device and another is not. The structure can be regard as a chip on chip package. The heat generated by the chips can be spread via the leads 210, however, the conventional chip on chip can not achieve the purpose. Further, the second chip 300c can be back to back stacked on the first chip 300 by die attaching material such as epoxy or the like. Alternatively, those openings 222b can be replaced by two slots 222a. Each inner lead 210 is exposed by the slots. If that one of the chips on different side surfaces will be interference by α particle radiation during the pack procedure, then the chips will be set on the two sides of the leadframe with different melting point solders, respectively. Finally, a under-filling process is performed to fill compound. Assume that both chips on both sides of the leadframe are interference by α particle radiation during the pack procedure, then the solder without lead or other radiation source is introduced during the formation.

Figure 9:
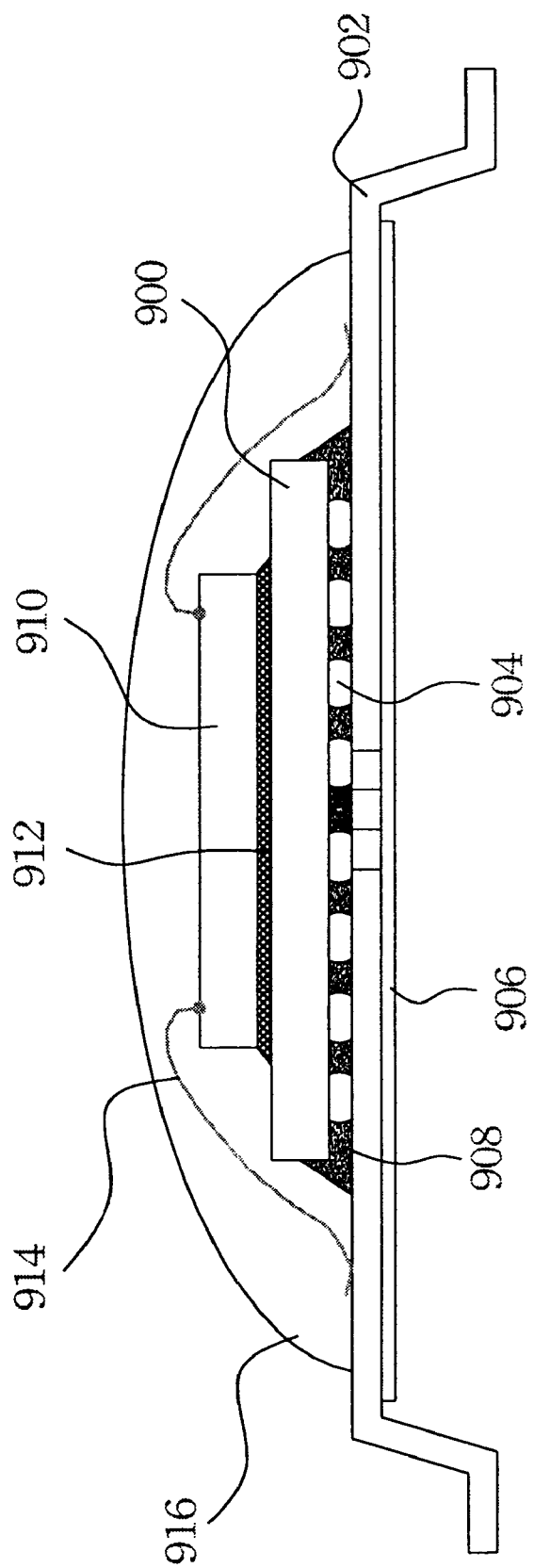
FIG. 9 shows the back to back package according to the present invention.

FIG. 9 shows another embodiment of the present invention. The package includes a first chip 900 on a first major surface of a leadframe 902 and electrically coupling to the leadframe by solder bumps 904. The first chip 900 is formed on the leadframe 902 by flip chip method. A adhesive material such as tape 906 is attached on a second major surface of the leadframe 902. Compound 908 is filled among the first chip 900, the solder bump 904 and the leadframe 902. A second chip 910 is formed on the top surface of the first chip 900 by attaching material 912 and electrically coupling to the leadframe by using conductive wires 914. The first chip 900 is relatively large to the second chip 910. Encapsulating material 916 covers the first chip 900 and the second chip 912. If the second chip 910 is a photosensitive chip. The compound 908 have to be filled in that space, then curing the package. Then, the second chip 910 is attached thereon. The following step is to connect the second chip 910 and the leadframe 902 by wire bounding. The encapsulating material 916 is preferably formed of transparent material. In the back to back packing method, one rerouting process can be save and the cost will be lower than the face to face packing method.

Figure 10A:
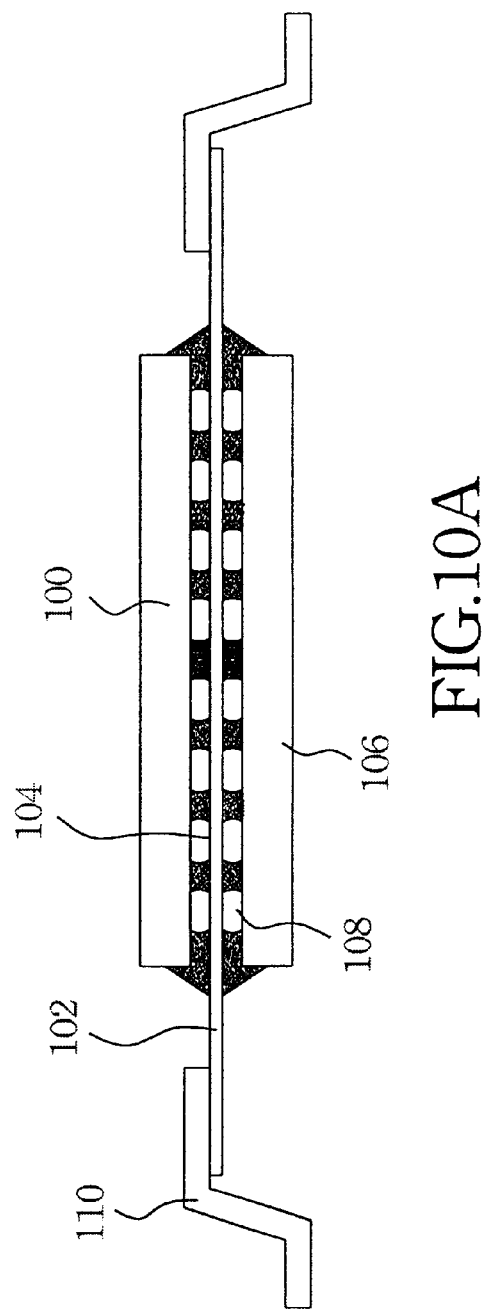
FIG. 10A and FIG. 10B are other embodiment with flexible printed circuit board according to the present invention.

FIG. 10A shows a further embodiment of the present invention. The package includes a first chip 100 that is electrically coupling to a first major surface of a flexible tape or a flexible printed circuit board 102 by solder bumps 104. A second chip 106 is also electrically coupling to a second major surface of the flexible tape 102 by solder bumps 108. Compound 110 is filled among the chips, the solder bump 104, 108 and the flexible tape 102. A plurality of electrical connecting members such as leads 110 is connected at the edges of the flexible tape 102. The two chips are face to face.

Figure 10B:
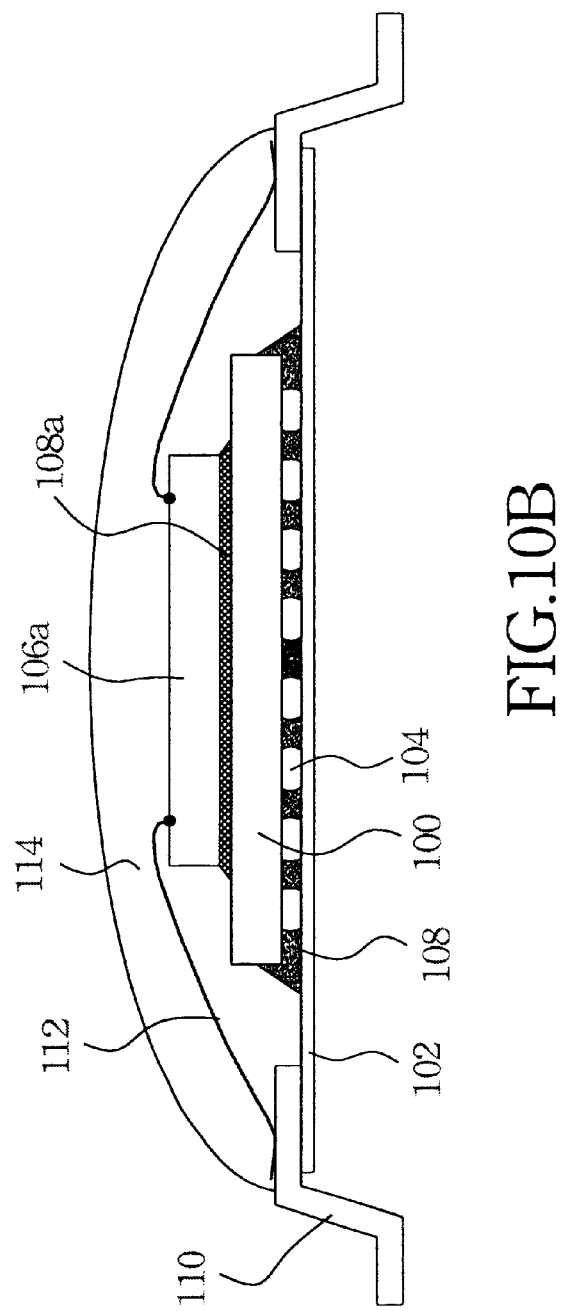

A modification of the embodiment according to FIG. 10A is shown in FIG. 10B. The difference is that the second chip 106a is attached on the first chip 100 by attaching material 108a. The second chip 106a is electrically connected to the leads 110 by using conductive wires 112. Similarly, encapsulating material 114 covers the first chip 100 and the second chip 106a.

Figure 11B:
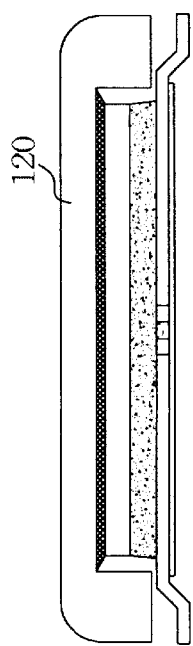
FIGS. 11A to 11D are other embodiments according to the present invention.
Figure 11C:
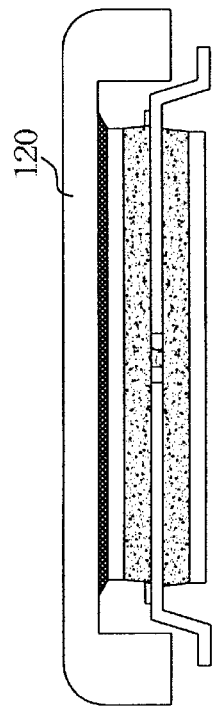
Figure 11D:
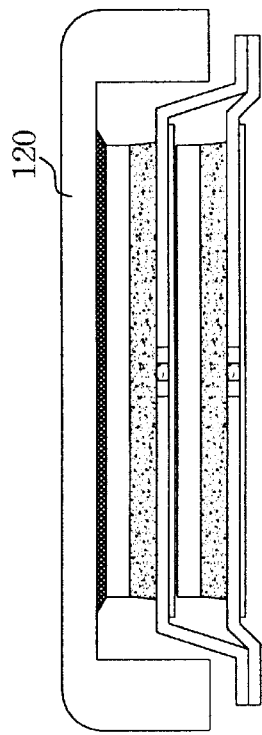
Figure 11A:
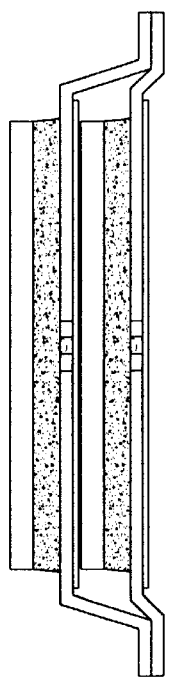

Referring to FIGS. 11A to 11D, which show the other embodiments according to the present invention. FIG. 11A illustrates that at least one package may be stacked on another package for three-dimension packing, wherein the leads of the two packages are connected together. FIG. 11B shows that a cover 120 is attached on the top of the package of FIG. 7B for spreading heat. FIG. 11C shows that a cover 120 is attached on the top of the package of FIG. 8C for spreading heat. FIG. 11D shows that a cover 120 is attached on the top of the package of FIG. 11A for spreading heat.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A semiconductor package, said semiconductor package comprising:

a leadframe having a plurality of leads;

adhesive material attached to an area under said leads, wherein said adhesive material has a plurality of openings to expose terminal portions of said leads;

a first chip connected to the upper surface of said leadframe by first conductive bumps for electrically coupling to said leads, wherein said adhesive material has an area larger than that of said first chip;

a second chip connected to the lower surface of said leadframe through said plurality of openings by second conductive bumps for electrically coupling to said leads, wherein said second chip is face to face to said first chip; and a first compound filled in the space among said first chip, said leadframe and said first conductive bumps.

2. The semiconductor package of claim 1, further comprising a decoupling capacitor on said leadframe and connected to two of said leads.

3. The semiconductor package of claim 1, wherein said adhesive material comprises a tape.

4. The semiconductor package of claim 1, further comprising a cover formed on said first chip.

5. The semiconductor package of claim 1, further comprising second compound filled in the space among said second chip, said leadframe and said second conductive bumps.

6. The semiconductor package of claim 1, further comprising:

a third chip attached on said first chip by attaching material;

bounding wires electrically coupling to said leads, wherein said third chip is back to back to said first chip; and encapsulating material formed on said first chip and said third chip.

7. A semiconductor package, said semiconductor package comprising:

a first leadframe having first leads;

first adhesive material attached on an area under said first leads;

a first chip connected to said first leadframe by first conductive bumps for electrically coupling to said first leads, wherein said first adhesive material has a surface at least larger than that of said first chip;

a first compound filled in the space among said first chip, said first leadframe and said first conductive bumps;

a second leadframe having second leads, wherein said first leads are connected to said second leads;

a second adhesive material attached IQ an area under said second leads;

a second chip connected to said second leadframe by second conductive bumps for electrically coupling to said second leads, wherein said second adhesive material has a surface at least larger than that of said second chip; and a second compound filled in the space among said second chip, said second leadframe and said second conductive bumps.

8. The structure of claim 7, further comprising a cover formed on said second chip.

9. A semiconductor package, said semiconductor package comprising:

a leadframe having a plurality of leads;

adhesive material attached to an area under said leads, wherein said adhesive material has slots formed therein to expose terminal portions of said leads;

a first chip connected to the upper surface of said leadframe by first conductive bumps for electrically coupling to said leads, wherein said adhesive material has an area larger than that of said first chip; and a second chip connected to the lower surface of said leadframe through said slots by second conductive bumps for electrically coupling to said leads, wherein said second chip is face to face to said first chip.

10. The semiconductor package of claim 9, further comprising a compound filled in the space among said first chip, said leadframe and said first conductive bumps and the space among said second chip, said leadframe and said second conductive bumps.

11. The semiconductor package of claim 9, further comprising:

a third chip attached on said first chip by attaching material;

bounding wires electrically coupling to said leads, wherein said third chip is back to back to said first chip; and encapsulating material formed on said first chip and said third chip.

* * * * *